(12) United States Patent
Minotti et al.

(10) Patent No.: US 8,471,370 B2
(45) Date of Patent: Jun. 25, 2013

(54) SEMICONDUCTOR ELEMENT WITH SEMICONDUCTOR DIE AND LEAD FRAMES

(75) Inventors: Agatino Carmelo Minotti, Cantania (IT); Alessandro Lo Piparo, Cantania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 30 days.

(21) Appl. No.: 13/070,075

(22) Filed: Mar. 23, 2011

(65) Prior Publication Data

US 2012/0025358 A1 Feb. 2, 2012

(30) Foreign Application Priority Data

Jul. 29, 2010 (IT) .............................. VI2010A0212

(51) Int. Cl.
*H01L 23/495* (2006.01)

(52) U.S. Cl.
USPC ............................ 257/666; 257/676; 257/773

(58) Field of Classification Search
USPC ................ 257/666, 676, 669, 672, 673, 735, 257/737, 773
See application file for complete search history.

(56) References Cited

U.S. PATENT DOCUMENTS

| | | | | |
|---|---|---|---|---|
| 3,564,352 A * | 2/1971 | Lehner | ......................... | 257/666 |
| 4,109,096 A * | 8/1978 | Dehaine | ........................ | 174/253 |
| 4,160,308 A * | 7/1979 | Courtney et al. | ............... | 438/25 |
| 4,637,130 A * | 1/1987 | Fujii et al. | ....................... | 29/827 |
| 4,766,478 A * | 8/1988 | Dennis | ........................... | 257/666 |
| 4,987,474 A * | 1/1991 | Yasuhara et al. | .............. | 257/666 |
| 4,994,412 A * | 2/1991 | Kalfus et al. | .................. | 438/123 |
| 5,166,098 A * | 11/1992 | Micic et al. | ..................... | 29/855 |
| 5,343,072 A * | 8/1994 | Imai et al. | ..................... | 257/666 |
| 5,444,294 A * | 8/1995 | Suzuki | .......................... | 257/666 |
| 5,614,759 A * | 3/1997 | Vandenheuvel et al. | ....... | 257/666 |
| 5,977,618 A * | 11/1999 | DiStefano et al. | ............ | 257/674 |
| 6,037,662 A * | 3/2000 | Yoon et al. | ..................... | 257/735 |
| 6,317,327 B1 | 11/2001 | Lin | | |
| 6,396,127 B1 * | 5/2002 | Munoz et al. | .................. | 257/666 |
| 2002/0130397 A1 * | 9/2002 | Yew et al. | ..................... | 257/666 |
| 2007/0090499 A1 * | 4/2007 | Tanaka | ........................... | 257/666 |
| 2007/0182003 A1 | 8/2007 | Huber | | |
| 2008/0224286 A1 | 9/2008 | Standing | | |
| 2008/0284008 A1 * | 11/2008 | Urushihata | .................... | 257/735 |

FOREIGN PATENT DOCUMENTS

JP 05315490 11/1993

OTHER PUBLICATIONS

Italian Patent Office Search Report and Written Opinion, mailed Feb. 16, 2011, for IT VI20100212 (9 pages).
English Language Abstract of JP 05315490 (1 page).

* cited by examiner

*Primary Examiner* — S. V. Clark
(74) *Attorney, Agent, or Firm* — Gardere Wynne Sewell LLP

(57) ABSTRACT

A semiconductor element to be mounted on a circuit carrier includes a semiconductor die and at least one lead frame. In order to reduce the size required for mounting a semiconductor die on a circuit carrier, a semiconductor element includes a semiconductor die and at least one lead frame. The at least one lead frame is directly attached to the semiconductor die at a connection region of the semiconductor die, and the connection region provides an electrical connection to and mechanical support for the semiconductor die.

28 Claims, 6 Drawing Sheets

SEMICONDUCTOR ELEMENT WITH SEMICONDUCTOR DIE AND LEAD FRAMES

PRIORITY CLAIM

This application claims priority from Italian Patent Application VI2010A000212, filed on Jul. 29, 2010, the disclosure of which is hereby incorporated by reference.

TECHNICAL FIELD

The present disclosure relates to a semiconductor element to be mounted on a circuit carrier, and more particularly to a semiconductor element comprising a semiconductor die and at least one lead frame.

BACKGROUND

Power electronic modules are semiconductor packages that are used in power electronic circuits. Power electronic modules are typically used in vehicular and industrial applications, such as inverters and rectifiers. The semiconductor components included in the power electronic modules are typically an insulated gate bipolar transistor (IGBT) or a metal-oxide semiconductor field effect transistor (MOSFET) implemented on a semiconductor die. The IGBT and MOSFET semiconductor die may have varying voltage and current ratings. Some power electronic modules also include additional semiconductor circuits (i.e. free-wheeling diodes) in the semiconductor die for overvoltage protection. Additionally, power electronic modules may further include some logical functionality in a semiconductor die.

In general, two different power electronic module designs are used. One design allows the power electronic module to be integrated in a surface mount device (SMD) package for mounting on a printed circuit board (PCB). A second design enables the power electronic module to combine multiple semiconductor dies for realizing a more complex integrated power electronic circuit.

An exemplary SMD package for mounting a power electronic module is shown in FIG. 7. In particular, FIG. 7 illustrates a top view of an exemplary power electronic module 200 with package 230 according to an exemplary embodiment of the related art.

As can be seen from FIG. 7, the SMD package 230 is formed in a parallelepiped shape, for example, out of plastic or ceramic. At a left and a right side, the package 230 provides a recess 245 enabling a secure mounting of the package 230 to a heat sink or to a printed circuit board (PCB). For electrically connecting a semiconductor die housed in the package 230, three leads 210-220 are provided on one side of the package. Each end portion of leads 210-220 forms a terminal for soldering the power electronic module 200 to a contact point of a PCB. Since FIG. 7 illustrates the top view of the package, only the external portions of leads 210-220 are shown.

Further, on the side of the package 230 opposite to leads 210-220, base plate 225 is shown. Base plate 225 is commonly used for mounting a semiconductor die. Additionally, base plate 225 provides mechanical support for the package 230. Further, a label 240 is provided on the front surface of package 230 in order to identify the housed power electronic module.

A further exemplary SMD package for mounting a power electronic module is shown in FIG. 8. In particular, FIG. 8 illustrates a side view of the exemplary power electronic module 200 with package 230 as shown in FIG. 7.

As can be seen from FIG. 8, the overall dimension of the SMD package 230 mounting the power electronic module is primarily determined by the size of the package 230. The thickness of package 230 mainly results from the thickness of the base plate 225 and the area for connecting the leads to the semiconductor die which will be further explained with respect to the exemplary embodiment shown in FIG. 10. In order to structurally attach leads 210-220 within package 230, the internal portion of each lead should be solidly rooted in package 230. The area of package 230 necessary for firmly fixing the leads to the package also adds to overall the size of package 230, which will be further explained with respect to the exemplary embodiment shown in FIG. 9.

In order to enable mounting package 230 at the back surface onto a PCB, the leads 210-220 are bent such that the end portion of each terminal is in the plane defined by the back surface of the package 230. In particular, the leads 210-220 are bent twice; firstly leads 210-220 are bent at a point close to the package exit point in a direction towards the back surface of package 230, and secondly leads 210-220 are bent at a point close to the end portion of leads 210-220 such that the end portion of leads 210-220 is in a same plane as that defined by the back surface of package 230.

On the side of package 230 opposite to leads 210-220, base plate 225 is shown to protrude from the package boundaries.

A further exemplary SMD package for mounting a power electronic module is shown in FIG. 9. In particular, FIG. 9 illustrates a cross-sectional top view of the exemplary power electronic module 200 with package 230 as shown in FIG. 7 and in FIG. 8.

As can be seen from FIG. 9, the package includes a semiconductor die 205, a main portion of base plate 225 and bond wires 235. In particular, the back surface of semiconductor die 205 is bonded to the base plate 225. The front plane of semiconductor die 205 provides structures for connecting wire bonds 235. In particular, the wire bonds 235 electrically connect the semiconductor chip 205 to the leads 210-220. Lead 210 is connected to the semiconductor die 205 via one wire bond 235. Lead 220 is connected to semiconductor die 205 via two parallel wire bonds 235. Lead 210 is connected to the back surface of the semiconductor die 205.

For a structurally secure attachment of leads 210-220 with package 230, the internal portion of leads 210-220 is shaped as an anchor with a hole at a center of the anchor head. In particular, molding the package the anchor shape of the internal portion of the leads 210-220 allows for a structurally firm attachment of leads 210-220 within the package 230.

Further, base plate 225 is formed to protrude from the package 230 at the side of the package 230 opposite to the leads. The illustrated exemplary power electronic module 200 is 10.18 mm wide and 15.55 mm long.

As can be seen from the exemplary SMD package illustrated in FIG. 9, the length of the package is mainly determined by the size of the semiconductor die 205 and the internal portions of the leads 210-220 necessary for firmly attaching the leads 210-220 within the package 230.

Another exemplary SMD package for mounting a power electronic module is shown in FIG. 10. In particular, FIG. 10 illustrates a cross-sectional side view of the exemplary power electronic module 200 with package 230 shown in FIG. 7, FIG. 8 and in FIG. 9.

In the package 230 of the power electronic module, the semiconductor die 205 is bonded at the back surface with the base plate 225. On the top surface of the semiconductor die 205, the wire bonds 235 are attached. As the internal portions of the leads 210-220 are not allowed to overlap the semiconductor die 205 or the base plate 225, the bond wires provide an electric connection between the semiconductor die 205 and the leads 210-220.

In particular, the package 230 shown in FIG. 10 provides a distance between the semiconductor die 205 and leads 210-220. By displacing the internal portions of the leads 210-220 in a vertical direction, the direction opposite to the back surface of the package 230, the horizontal distance between the leads 210-220 and the semiconductor die 205 can be maintained. Thereby, the thickness is determined by the thickness of the base plate 225, the thickness of the semiconductor die 205, and additionally the displacement required for the leads 210-220. Consequently, the thickness of the package 230 is increased in order to keep the length of the package at a minimum.

The displacement between the semiconductor die 205 and the leads 210-220 may be necessary to ensure a secure and correct position of the semiconductor die 205, the base plate 225 and the leads 210-220 when molding/casting the package 230 of the power electronic module 200.

Further, the bond wires 235 are provided in a curved and not a flat shape. Between different connection points, the bond wires 235 are curved in order to avoid mechanical stress at the connection points of the bond wire 235 during the molding/casting of the package 230. The illustrated SMD package 230 is 4.45 mm thick.

An exemplary embodiment of the second design enabling the power electronic module 300 to combine multiple semiconductor dies is shown in FIG. 11. In particular, FIG. 11 illustrates a top view of the exemplary power electronic module with a semiconductor die mounted on an insulating substrate.

As can be seen from FIG. 11, the semiconductor die 305 is bonded at its back surface with a region of the insulating substrate 315 to form a power electronic module 300. In addition, the insulating substrate 315 and active regions 310 are provided on the substrate of the power electronic module. In order to allow for a secure mounting of the semiconductor die 305 on the insulating substrate 315, the active regions 310 and the semiconductor die 305 have to be spaced at a predefined distance (namely a keep-out area). In particular, the placement of multiple semiconductor dies on a same insulating substrate results in large keep-out areas which cannot be used for active regions.

Another exemplary embodiment of the second design enabling the power electronic module 300 to combine multiple semiconductor dies is shown in FIG. 12. In particular, FIG. 12 illustrates a perspective view of the exemplary power electronic module 300 shown in FIG. 11.

As can be seen from FIG. 12, the semiconductor die 305 is also bonded at its back surface with a region of the insulating substrate 315 to form power electronic module 300. Further, the semiconductor die 305 is also placed at a distance to the active regions 310 in order to maintain a keep-out area around the semiconductor die 305.

SUMMARY

An embodiment of the present disclosure proposes a new semiconductor element improving the size required for mounting a semiconductor die on a circuit carrier. A new mounting of a semiconductor die according to the present disclosure may improve the thermal dissipation of a semiconductor element. Also, a package for a new semiconductor element including a semiconductor die may result in superior reliability to thermo mechanical stress.

A first aspect of an embodiment of the present disclosure provides a semiconductor element with lead frames that are directly attached to the semiconductor die. Therefore, additional parts, namely the wire bonds, bond plate, the molded package, displaced inner portions of the lead frames etc. can be omitted. Thus, the size reduction of the semiconductor element with the lead frames directly attached to the semiconductor die is high. In particular, the connection between the lead frames and the semiconductor die provides an electrical connection and mechanical support.

In an exemplary implementation to the first aspect, the lead frames may be directly attached to either of two sides of the semiconductor die, namely the front and the back side.

A second aspect of an embodiment is to provide a semiconductor element with lead frames, which are directly attached to the semiconductor die and have a loop shape with an opening achieving an improved thermal dissipation. The semiconductor die is sandwiched between lead frames from both sides. Each lead frame has an opening for an improved thermal dissipation. Accordingly, the design of the semiconductor element enables the semiconductor die to dissipate heat through its front surface and its back surface and not just through one surface of the semiconductor die which is bonded with the metallic bond plate.

Another exemplary implementation according to the first and the second aspect may provide the semiconductor element with the lead frames directly attached to the semiconductor die in a molded package for a high level of protection.

A further, third aspect of an embodiment is suggesting a new semiconductor element wherein the lead frames in a package are attached without wired interconnections to the semiconductor die. In particular, as no wired interconnections are present, the package shows a superior reliability to thermo mechanical stress such as thermal/power cycles, vibration, etc.

In an exemplary implementation of to the first, second and third aspects, the semiconductor element may be a power electronic module realized in at least one of the following materials: Silicon (Si), Gallium-arsenide (GaAs) and all other known semiconductor materials.

The three aspects of the present disclosure may be combined for an advantageous implementation of a semiconductor module.

One embodiment of the present disclosure provides a semiconductor element to be mounted on a circuit carrier comprising a semiconductor die; and at least one lead frame. Each of the at least one lead frame is directly attached to the semiconductor die at a connection region of the semiconductor die, and the connection region provides an electrical connection to and mechanical support for the semiconductor die.

In one exemplary embodiment, a first lead frame is attached to a first surface of the semiconductor die and a second lead frame is attached to a second surface of the semiconductor die such that the semiconductor die is sandwiched between two lead frames.

In another exemplary embodiment, an end portion of each lead frame is formed as a terminal for mounting the semiconductor die on a circuit carrier and the connection region of the semiconductor die is formed in a loop shape, and each lead frame is provided with an opening surrounded by a loop shaped portion of the lead frame which is attached to the loop shaped connection region of the semiconductor die, the opening of each lead frame enabling heat dissipation of the semiconductor die.

Furthermore, the semiconductor die may comprise active regions. In this case, the loop shaped connection region of the semiconductor die may be adjusted to the active regions of the semiconductor die.

The semiconductor element may also have an end portion of each lead frame that is bent to form the terminal of the semiconductor element to be mounted on the circuit carrier such that the plane defined by the semiconductor die extends across the plane defined by the at least one lead frame terminal.

According to another exemplary embodiment, the end portion of each lead frame points in the direction of the surface of the semiconductor die to which the lead frame is attached and the length of the end portion of each lead frame enables mounting all terminal portions of the lead frames attached to the semiconductor die adjacently on a surface of the circuit carrier.

Further, the semiconductor die and the at least one lead frame may be housed in a package.

In a further exemplary implementation, the attachment of each lead frame to the semiconductor die at the connection region is realized by one of the following: silver sintering, conductive gluing, riveting, laser welding or resistance welding.

Another alternative embodiment of the present disclosure provides semiconductor module comprising: at least on semiconductor element and a circuit carrier. The semiconductor element includes a semiconductor die and at least one lead frame a circuit carrier with at least one electrically conductive lead. Each of the at least one lead frame is directly attached to the semiconductor die at a connection region of the semiconductor die, the connection region providing an electrical connection to and mechanical support for the semiconductor die. The circuit carrier includes at least one electrically conductive lead, wherein the at least one lead frame of the at least one semiconductor element is connected to the at least one electrically conductive lead of the circuit carrier.

In one exemplary embodiment, the at least one lead frame of the at least one semiconductor element is connected to the at least one electrically conductive lead of the circuit carrier such that the plane defined by the semiconductor die extends across the plane defined by the circuit carrier.

In another exemplary embodiment, a first lead frame of the semiconductor element is attached to a first surface of at least one the semiconductor die and a second lead frame of the semiconductor element is attached to a second surface of the at least one semiconductor die such that the at least one semiconductor die is sandwiched between two lead frames.

In a further exemplary implementation, the connection between at least one lead frame of at least one semiconductor element and at least one electrically conductive lead of the circuit carrier is realized by one of the following: silver sintering, soldering, riveting, brazing, laser welding or resistance welding.

A further alternative embodiment provides a method of manufacturing a semiconductor element to be mounted on a circuit carrier by providing a semiconductor die; by stamping a predetermined metal plate to form at least one lead frame; and by directly attaching each of the at least one lead frame to the semiconductor die at a connection region of the semiconductor die, the connection region providing an electrical connection to and mechanical support for the semiconductor die.

In an exemplary embodiment, a first lead frame is attached to a first surface of the semiconductor die and a second lead frame is attached to a second surface of the semiconductor die such that the semiconductor die is sandwiched between at least two lead frames.

Furthermore, an end portion of each lead frame may be bent to form a terminal of the semiconductor element to be mounted on the circuit carrier such that the plane defined by the semiconductor die extends across the plane defined by the at least one lead frame terminal.

BRIEF DESCRIPTION OF THE DRAWINGS

Embodiments of the present disclosure are described in more detail referring to the attached figures and drawings. Similar or corresponding details in the figures are marked with the same reference numerals.

DETAILED DESCRIPTION OF THE DRAWINGS

Figure 1:
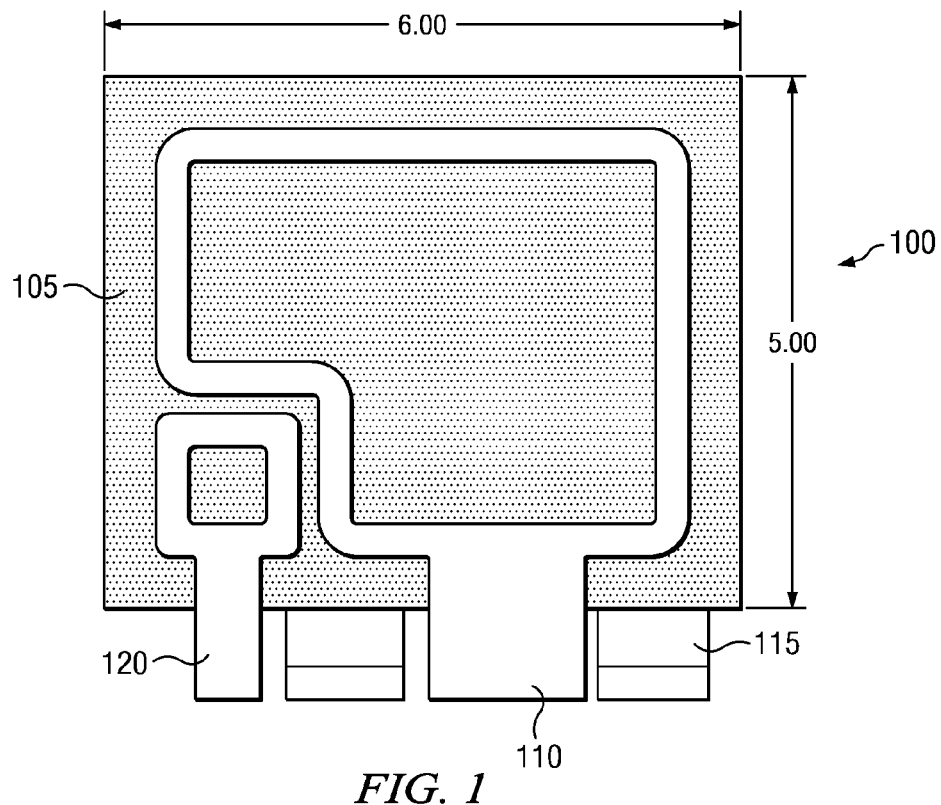
FIG. 1 is a schematic front view of the semiconductor element according to an exemplary embodiment of the present disclosure.

FIG. 1 is a schematic front view of the semiconductor element according to an exemplary embodiment of the present disclosure.

Referring now to FIG. 1, semiconductor element 100 includes: the semiconductor die 105 and lead frames 110-120. The lead frames 110-120 may be formed by a process of stamping a metal plate. As shown in FIG. 1, the semiconductor die 105 has a surface area of 6.00 mm by 5.00 mm.

In particular, the lead frames 110-120 are directly attached to the surface of the semiconductor die 105. The connection between the surfaces of each of the lead frames 110-120 and the surface of the semiconductor die 105 provides an electrical connection and a mechanical support. Such a connection may be realized by bonding each of the lead frames 110-120 at a connection region to the semiconductor die 105. The connection region may be realized as a die pad positioned underneath each lead frame 110-120.

The connection between semiconductor die 105 and lead frames 110-120 may be implemented employing the silver sinter technology. For silver sintering the semiconductor die 105 to lead frames 110-120, a layer of silver sinter particles is provided between the semiconductor die 105 and each lead frames 110-120. Thereafter, the semiconductor die 105 and the lead frames 110-120 are connected by applying a predetermined pressure at a predetermined temperature. Thereby, a stable connection between semiconductor die 105 and frames 110-120 is provided.

Alternately, the connection between semiconductor die 105 and lead frames 110-120 may also be realized using solder, conducting glue, rivets or the semiconductor die 105 and lead frames 110-120 can be brazed, laser welded or a resistance welded. The appropriate implementation of the connection depends on the required time and temperature for the bonding procedure. If the temperature is applied for too long, the semiconductor die 105 and the lead frames 110-120 may be destroyed.

In order to improve the conducting properties, the stability and the bonding process for the lead frames 110-120, appropriate metals may be selected for the lead frames 110-120. The lead frames 110-120 may also be coated with suitable metallization layers, where the coating has additional advantages over the metal interior.

The lead frames 110-120 are attached to two sides of the semiconductor die 105 for structurally supporting and for electrically connecting the semiconductor die 105. For this purpose, the semiconductor die 105 provides at least one connection region, e.g. a die pad, on each of the two sides of the semiconductor die 105, wherein the die pads are connected to active regions of the semiconductor die 105.

With lead frames 110-120 attached to both sides of the semiconductor die 105, the semiconductor die 105 is sandwiched between the lead frames 110-120. Thereby, the lead frames 110-120 provide sufficient mechanical support for mounting the semiconductor die 105 in a vertical position (i.e. the term vertical defines the orientation of the semiconductor die 105 in view of its mounting on a circuit carrier, e.g. on a PCB).

Accordingly, the semiconductor element 100 does not require a molded package surrounding the semiconductor die 105 and the lead frames 110-120 for a mechanically stable mounting of the semiconductor element 100. However, if a high level of protection is required, a package can additionally be provided surrounding the semiconductor die 105 and the lead frames 110-120. The package may be provided by way of molding, casting etc. of a material as e.g. plastics, ceramics or other materials commonly used for packages.

Further, a package may be also be provided by potting the semiconductor die 105 with a siliconic gel. Alternatively, the semiconductor die 105 may be enclosed by two plastic halves, commonly known for instance from SD memory chips. By employing any of the above described or alternatively known packaging technologies for a semiconductor die 105, the semiconductor die 105 can be protected from outside influences, as e.g. physical contacts, mechanical stress, humidity etc.

The lead frames 110-120 include a portion, which is attached to the semiconductor die 105, and a portion formed as a terminal for mounting the semiconductor element 100 on a circuit carrier, i.e. a PCB.

The portion of each lead frame 110-120 for attachment to the semiconductor die 105 is provided in a loop shape. The loop of each lead frame 110-120 is planar. Accordingly, the loop portion of the lead frames 110-120 can be attached to the flat surface of semiconductor die 105 at all point of the loop portion of the lead frames 110-120. Thereby, a mechanically secure attachment of each lead frame 110-120 to the semiconductor die 105 is achieved.

For instance, the portion of the lead frame 120 is provided in a generally square loop shape. Further, the portion of the lead frame 110 is formed as a polygon with six edges surrounding the loop shaped portion of lead frame 110. In the example of the semiconductor element 100 shown in FIG. 1, the loop shaped portions of the lead frames 110 and 120 are provided to maximize the enclosed area of the surface of the semiconductor die 105.

By providing the portion of lead frames 110-120 attached to the semiconductor die 105 in a loop shape, the cooling of the semiconductor die 105 is improved. In particular, the opening in the lead frames 110-120 which is surrounded by the loop portion of lead frames 110-120 allows for cooling the surface of the semiconductor die 105. For instance cool air or thermo conductive but insulating liquids, can be brought into direct contact with the surface of the semiconductor die 105 on both sides. Accordingly, the thermal dissipation of the semiconductor die 105 is advantageous to a standard design with a bond plate bonded to one side of a semiconductor die.

Further, the loop shape of each lead frame 110-120 may be adapted corresponding to the shape of active regions within the semiconductor die 105. The placement of active regions within the semiconductor die 105 determines the functionality of the semiconductor element 100. By adjusting the loop shape portion of each lead frames 110-120 to an active region of the semiconductor die 105, an evenly distributed potential can be supplied thought the connection region to the active region due to the plurality of feeding points, namely the feeding region. Thereby, a loop shape of the lead frames 110-120 allows for supplying an active region of the semiconductor die 105 with an evenly distributed potential.

Figure 2:
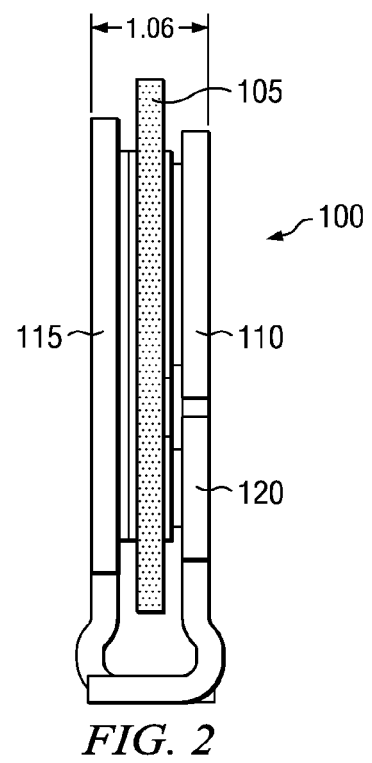
FIG. 2 is a schematic side view of the semiconductor element according to an exemplary embodiment of the present disclosure.

FIG. 2 is a schematic side view of the semiconductor element according to an exemplary embodiment of the present disclosure.

Referring now to FIG. 2, the semiconductor element 100 is shown with semiconductor die 105 sandwiched between lead frame 115 on the left side and lead frame 110 and 120 on the right side.

FIG. 2 also shows the connection layer between semiconductor die 105 and lead frames 110-120 from a side. In particular, between the semiconductor die 105 and lead frame, a layer of bonding material is shown. The bonding material allows for directly attaching the lead frames 110-120 to the surface of the semiconductor die. As FIG. 2 is a schematic illustration, the thickness of the bond layer is exemplary. The thickness of the bond layer may vary. In particular, the thickness of the bond layer depends on the technology used for bonding the lead frames 110-120 with the semiconductor die 105. For instance, a silver sinter layer may be around five times thinner than a soldering layer.

Further, the end portions of the lead frames 110-120 are shown to be formed as terminals. For an end portion of a lead frame to realize a terminal, the end portion needs to provide a surface as a contact portion for mounting on a circuit carrier, i.e. a PCB. This contact surface is provided by the lead frames 110-120 having a bent end portion.

In particular, the end portion of each lead frame is bent to form the terminal for mounting on the circuit carrier such that the contact plane is generally perpendicular to the plane defined by the semiconductor die 105. In other words, the plane defined by the semiconductor die intersects or extends across the contact plane defined by the at least one lead frame terminal. The plane defined by the at least one lead frame terminal is exemplary shown in FIGS. 4 and 5. The orientation of the contact surface of lead terminals 110-120 allows for a vertical mounting of the semiconductor element 100 on a circuit carrier.

In particular, the terminal end portion of each lead frame 110-120 is bent inwardly so that it points in the direction towards the surface of the semiconductor die 105 to which it is attached. Further, the length of the end portion of each lead frame is adjusted. Thereby, the mounting of all terminal end portions of the lead frames 110-120 attached to a single semiconductor die 105 on a circuit carrier is facilitated. Due to the bent and the adjusted length of the terminal end portions of the lead frames 110-120, the terminals may be mounted adjacently on a strip of contact points provided by the circuit carrier.

Alternatively, the terminal end portion of each lead frame 110-120 may be bent outwardly so that it realizes a gull-wing pin form commonly known for mounting integrated circuits. Thereby, a stable mounting of the semiconductor element 100 on a circuit carrier can also be achieved.

Further, the terminal end portions of each lead frame 110-120 may be provided as straight tapered terminal pins. With pin shaped terminals, the lead frames 110-120 may be inserted into through holes drilled in the circuit carrier. By way of soldering, the semiconductor element 100 may be connected to the circuit carrier. However, not all technologies are applicable for connecting a pin shaped terminal to a matching connection hole in a circuit carrier. For instance, the silver sinter technology cannot be used for providing a pin connection as the amount of pressure to be applied onto the contact layer between the two surfaces is limited. Further, a pin connection may not be as mechanically stable as the surface mounting of bent terminals to the circuit carrier.

Figure 3:
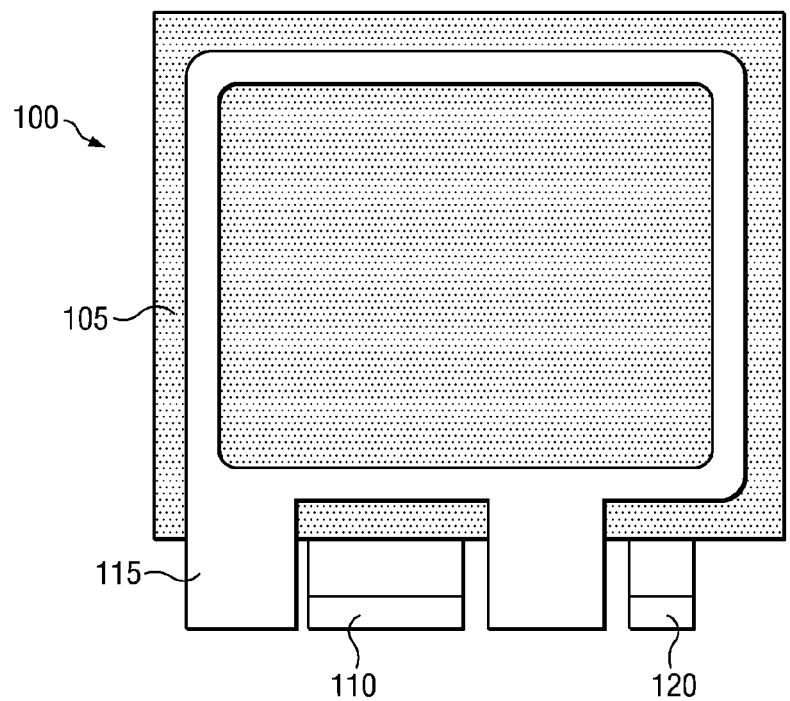
FIG. 3 is a schematic back view of the semiconductor element according to an exemplary embodiment of the present disclosure.

FIG. 3 is a schematic back view of the semiconductor element according to an exemplary embodiment of the present disclosure.

Referring now to FIG. 3, the semiconductor element 100 is shown with semiconductor die 105 and lead frame 115 directly attached to the semiconductor die 105. In particular, the loop shape portion of the lead frame 115, which is attached to the semiconductor die 105, extends to cover almost the whole surface of the semiconductor die 105. Accordingly, also lead frame 115 may be designed to maximize the surface area of the semiconductor die 105 enclosed by the loop shape portion.

Further, in order to allow for secure mounting of the semiconductor die 105, lead frame 115 provides two terminal end portions. Both terminal end portions of lead frame 115 are bent inwardly to point in a direction of the surface of the semiconductor die 105. Further, the terminal end portions of the lead frames 110-120 are provided in an alternating manner.

In particular, regarding the alignment of multiple terminal, the sequence of terminals alternates between a terminal realized by a lead frame attached to one side of the semiconductor die 105 and a terminal realized by a lead frame attached to another side of the semiconductor die 105. In other words, the terminal end portion of a lead frame attached to one side of the semiconductor die 105 is neighbored by a terminal end portion of a lead frame attached to another side of the semiconductor die 105.

The alternating mounting of terminal end portions of lead frame 110-120 attached to one and another side of the semiconductor die 105 to a circuit carrier allows for a mechanically stable placement of the semiconductor element 100, which increases its resistance to mechanical stress i.e. vibrations.

Figure 4:
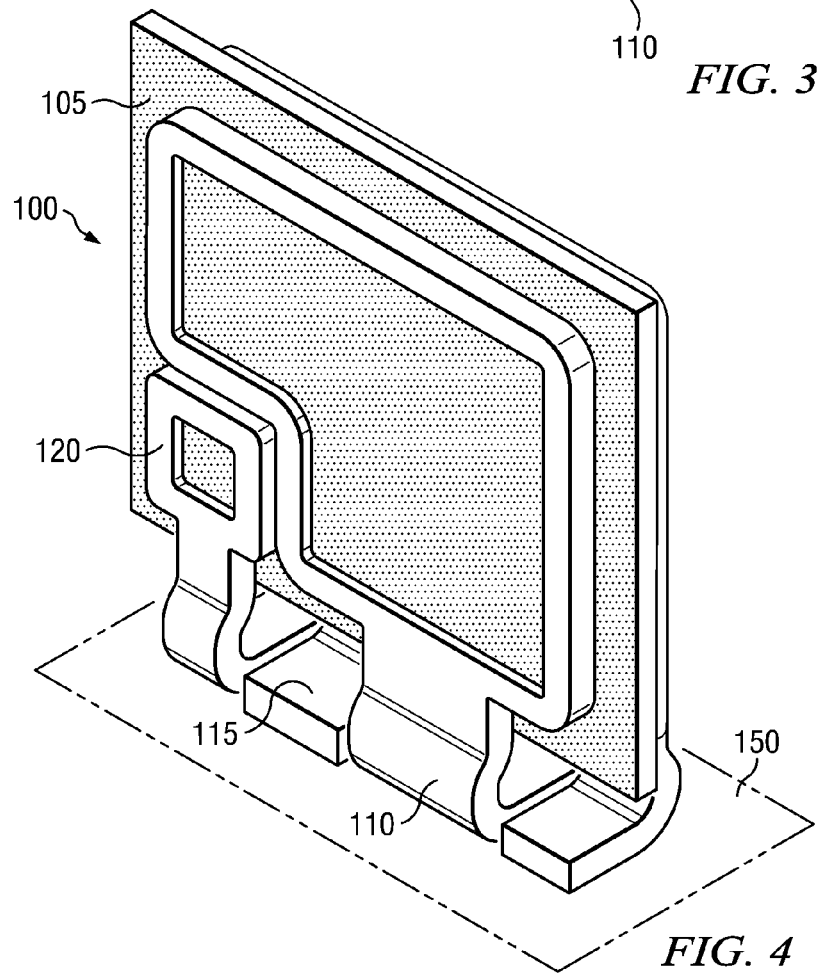
FIG. 4 is a schematic perspective front side view of the semiconductor element according to an exemplary embodiment of the present disclosure.

FIG. 4 is a schematic perspective front side view of the semiconductor element according to an exemplary embodiment of the present disclosure. Further, FIG. 5 is a schematic perspective back side view of the semiconductor element according to an exemplary embodiment of the present disclosure.

Figure 5:
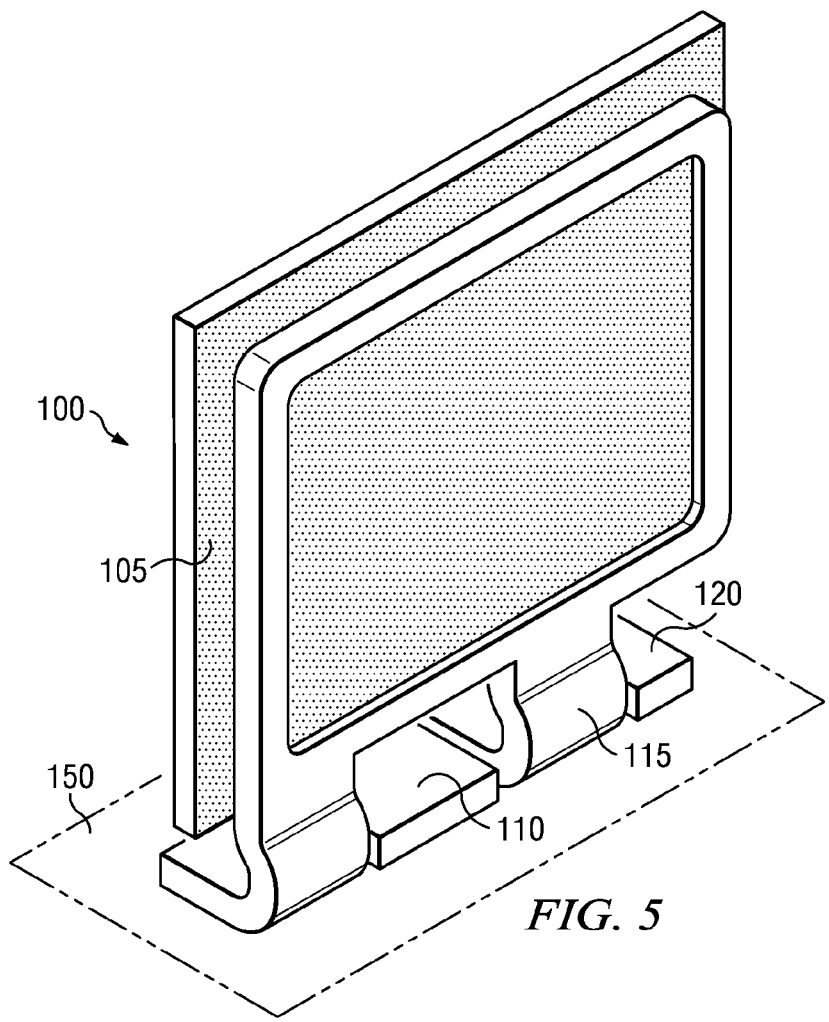
FIG. 5 is a schematic perspective back side view of the semiconductor element according to an exemplary embodiment of the present disclosure.

Both FIGS. 4 and 5 illustrate the semiconductor element 100 with lead frames 110-120 connected to the two sides of a semiconductor die 105 from a frontal and a backward perspective. Due to the schematic perspective view, the rectangular profiles of the lead frames 110-120 are shown. Further, the opening of each of the lead frames 110-120, which allows for a better cooling of the semiconductor die 105 surface can be seen.

Further, in FIGS. 4 and 5 the plane 150 formed by the terminal end portions of the lead frames 110-120 has been added. Relative to this plane 150, the plane formed by the semiconductor die 105 is vertical. In other words, the plane defined by the semiconductor die 105 intersects or extends across the plane 105 defined by the terminal end portions of the at least one lead frame 110-120.

Figure 6:
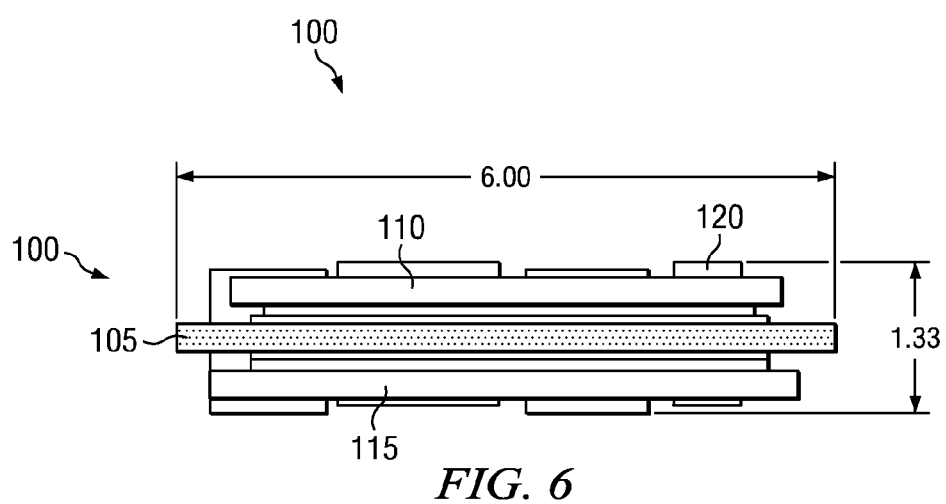
FIG. 6 is a schematic top view of the semiconductor element according to an exemplary embodiment of the present disclosure.
Figure 7:
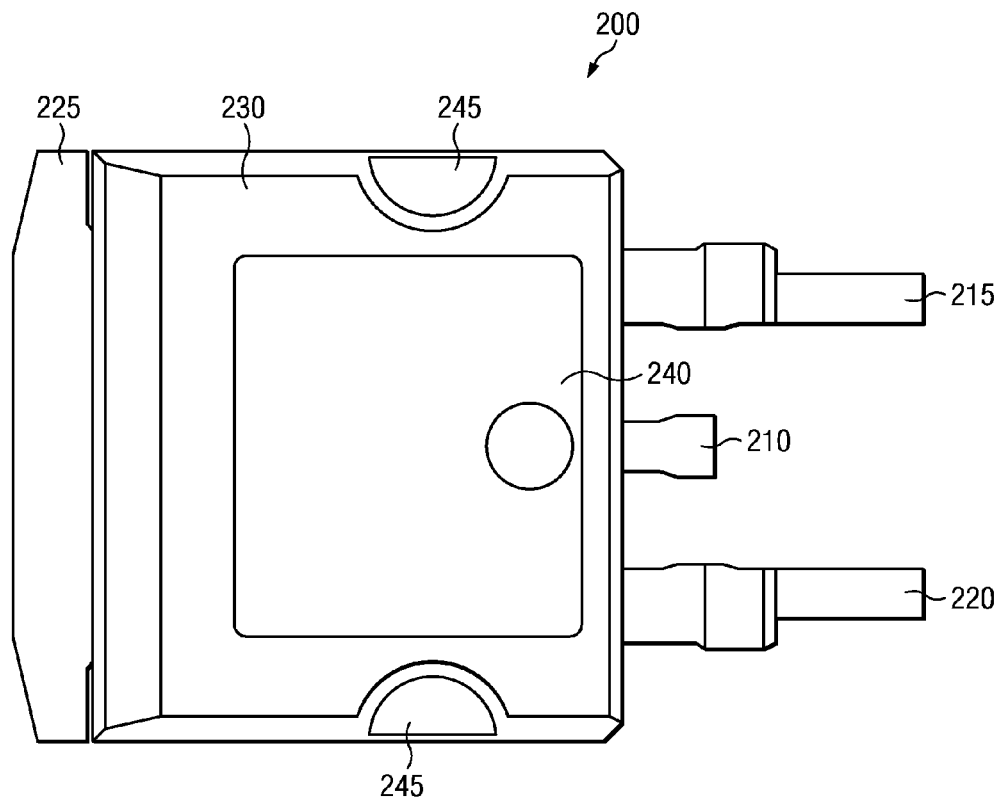
FIG. 7 is a schematic top view of a power electronic module with a package for mounting a power electronic module according to a related art.
Figure 8:
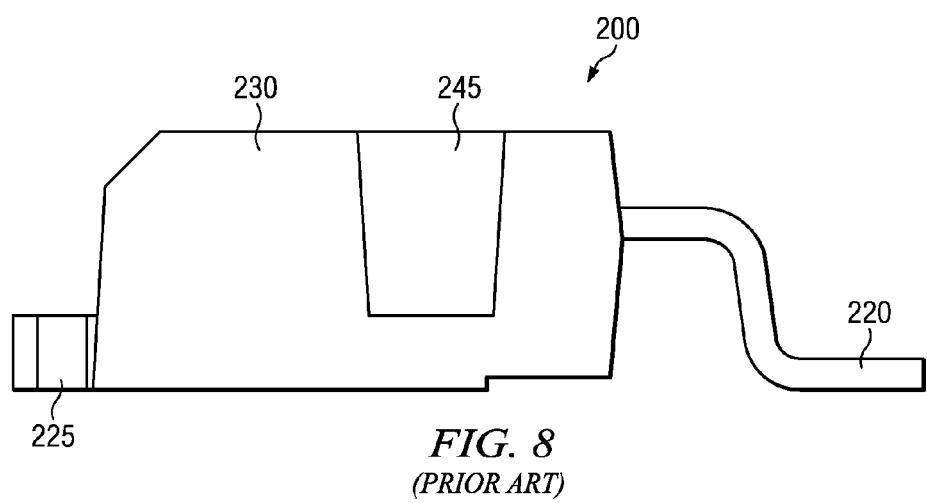
FIG. 8 is a schematic side view of a power electronic module with a package according to a related art.
Figure 9:
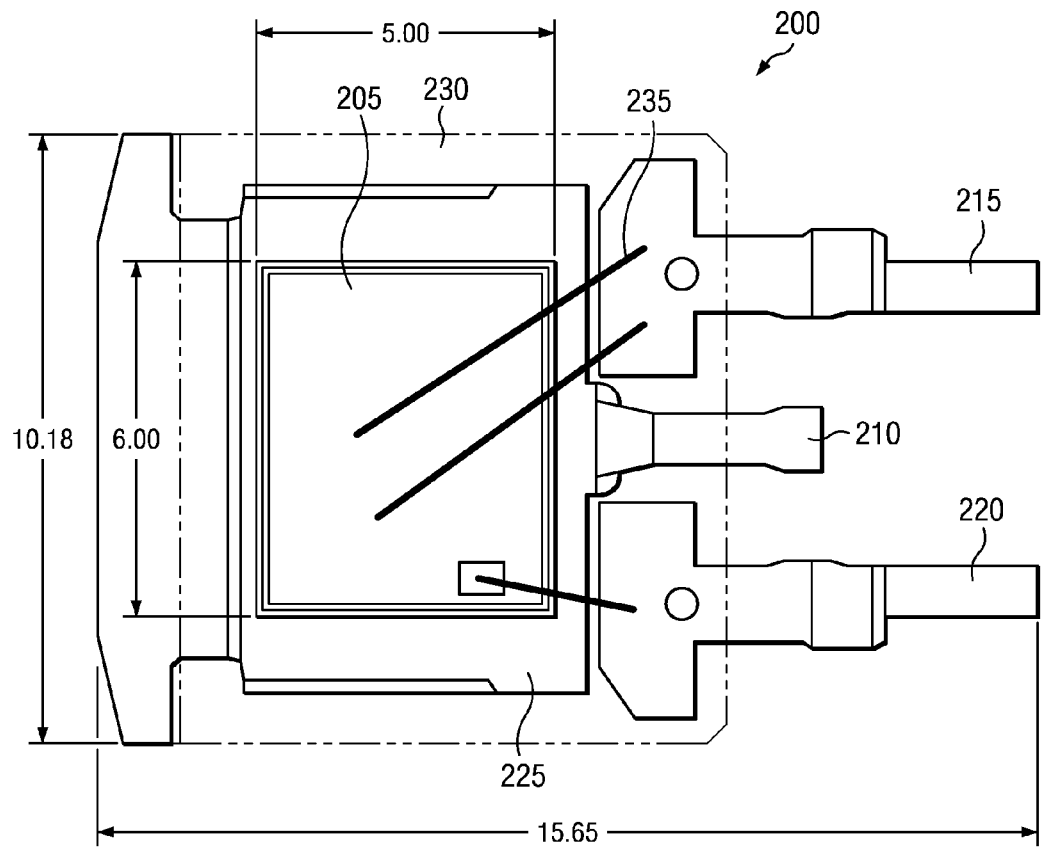
FIG. 9 is a schematic cross-sectional top view of a power electronic module with a package according to a related art.
Figure 10:
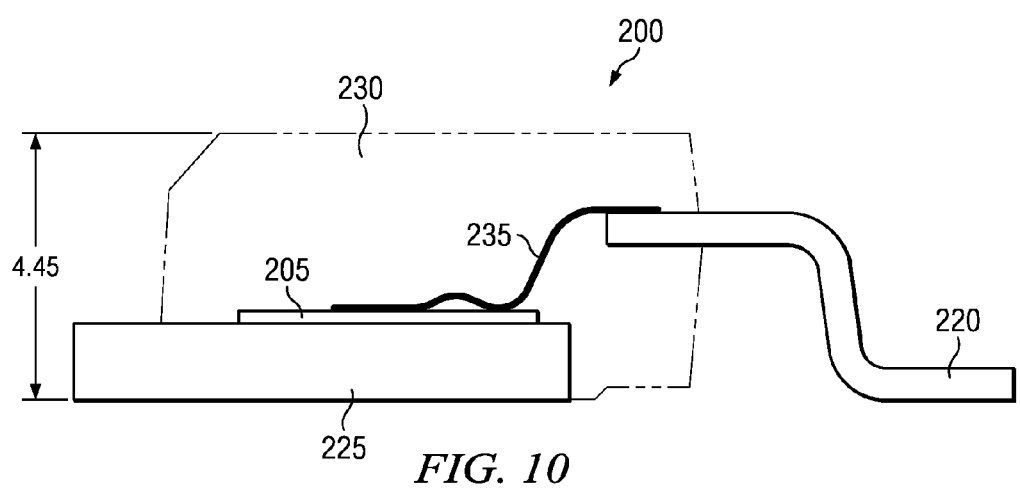
FIG. 10 is a schematic cross-sectional side view of a power electronic module with a package according to a related art.
Figure 11:
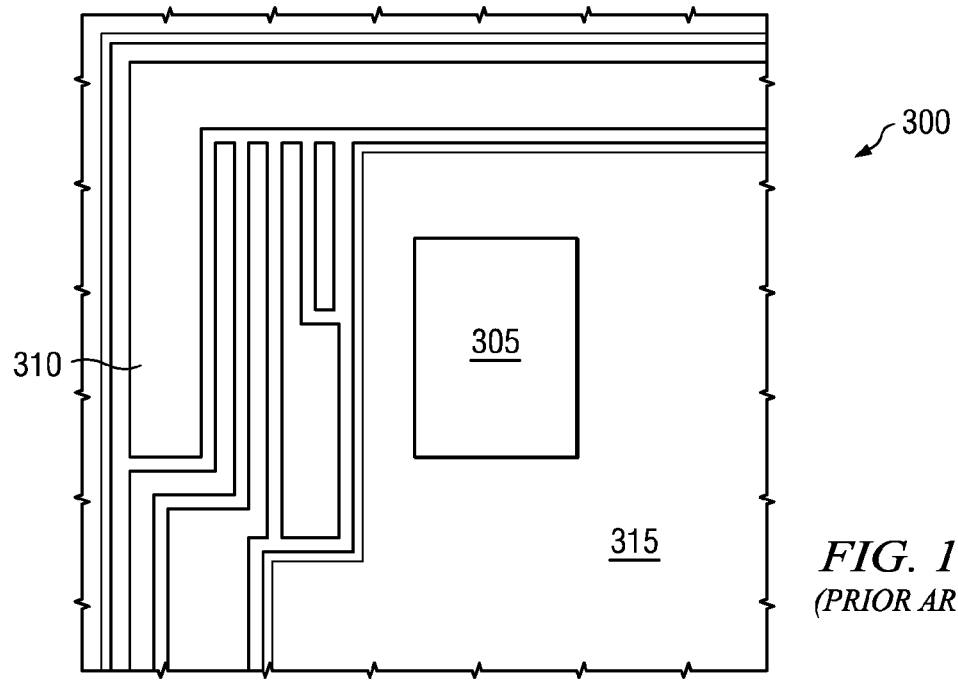
FIG. 11 is a schematic top view of a power electronic module with a semiconductor die mounted on an insulating substrate according to a related art.
Figure 12:
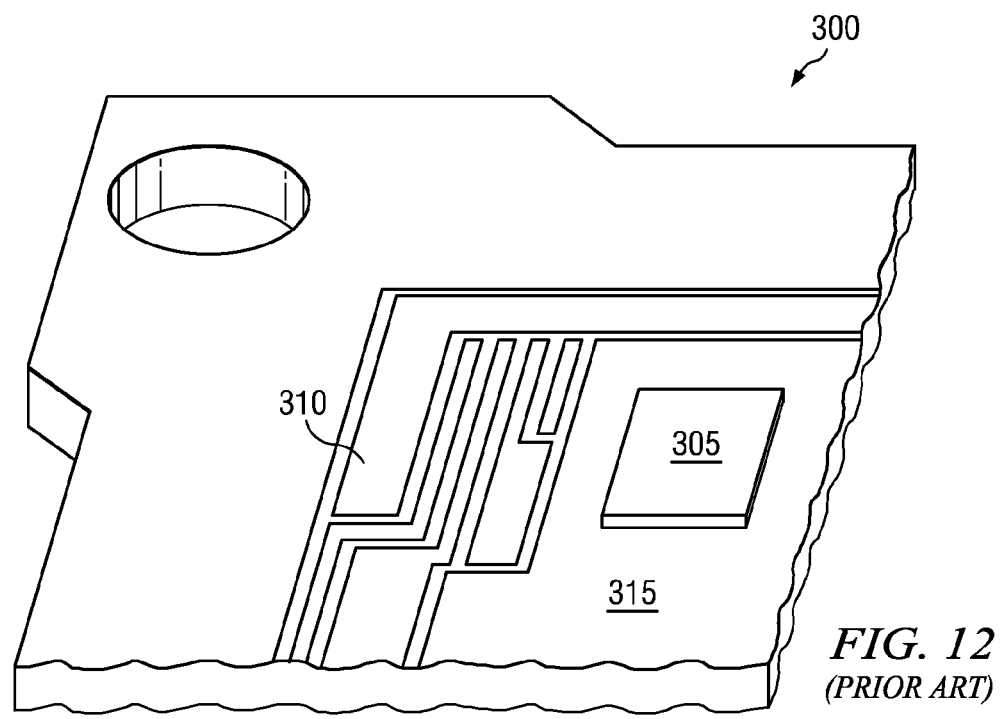
FIG. 12 is a schematic perspective view of a power electronic module with a semiconductor die mounted on an insulating substrate according to a related art.

FIG. 6 is a schematic top view of the semiconductor element according to an exemplary embodiment of the present disclosure.

Referring to FIG. 6, the semiconductor element 100 is shown with the semiconductor die 105 being sandwiched by lead frames 110-120 from the top. The connection layer between the lead frames 110-120 and the semiconductor die surface are also shown. In the illustrated example of the semiconductor element 100, the semiconductor element is 1.33 mm deep.

What is claimed is:

1. A semiconductor element comprising:
   a semiconductor die; and
   at least one lead frame;
   wherein an end portion of the at least one lead frame is formed as a terminal for mounting the semiconductor die on a circuit carrier, and
   wherein the at least one lead frame is formed in a loop shape that is attached at all points of the loop shape to one side of the semiconductor die at a connection region covering less than all of said one side of the semiconductor die, the connection region providing an electrical connection to and mechanical support for the semiconductor die.

2. The semiconductor element according to claim 1, wherein a first lead frame is attached to a first surface of the semiconductor die and a second lead frame is attached to a second surface of the semiconductor die such that the semiconductor die is sandwiched between two lead frames.

3. The semiconductor element according to claim 1, wherein the semiconductor die comprises active regions; and
   wherein the loop shaped lead frame is attached to the active regions of the semiconductor die.

4. The semiconductor element according to claim 1, wherein the end portion of each lead frame is bent to form the terminal of the semiconductor element to be mounted on the circuit carrier such that the plane defined by the semiconductor die extends across the plane defined by the at least one lead frame terminal.

5. The semiconductor element according to claim 4, wherein the end portion of each lead frame points in the direction of the surface of the semiconductor die to which the lead frame is attached and the length of the end portion of each lead frame enables mounting all terminal portions of the lead frames attached to the semiconductor die adjacently on a surface of the circuit carrier.

6. The semiconductor element according to claim 1, wherein the semiconductor die and the at least one lead frame is housed in a package.

7. The semiconductor element according to claim 1, wherein the attachment of each lead frame to the semiconductor die at the connection region is realized by one of the following: silver sintering, conductive gluing, riveting, brazing, laser welding or resistance welding.

8. A semiconductor module comprising:
at least one semiconductor element including:
a semiconductor die, and
at least one lead frame,
wherein the at least one lead frame is attached to the semiconductor die at a connection region providing an electrical connection to and mechanical support for the semiconductor die, wherein the at least one lead frame is formed in a loop shape that is attached at all points of the loop shape to one side of the semiconductor die; and
a circuit carrier;
wherein the at least one lead frame of the at least one semiconductor element is connected to the circuit carrier.

9. The semiconductor module according to claim 8, wherein an end portion of the at least one lead frame of the at least one semiconductor element is connected to the circuit carrier such that the plane defined by the semiconductor die extends across the plane defined by the circuit carrier.

10. The semiconductor module according to claim 8, wherein a first lead frame of the semiconductor element is attached to a first surface of at least one the semiconductor die and a second lead frame of the semiconductor element is attached to a second surface of the at least one semiconductor die such that the at least one semiconductor die is sandwiched between two lead frames.

11. The semiconductor module according to claim 8, wherein the connection between at least one lead frame of at least one semiconductor element and the circuit carrier is realized by one of the following: silver sintering, soldering, riveting, brazing, laser welding or resistance welding.

12. An apparatus, comprising:
a semiconductor die; and
at least one lead frame coupled to a first planar surface of one side of the semiconductor die along a portion less than all of said one side of the semiconductor die, the first planar surface lying in a first plane, wherein the at least one lead frame includes a loop shaped portion attached at all points of the loop shaped portion to said one side of the semiconductor die;
wherein the at least one lead frame includes a terminal portion, the terminal portion including a planar contact portion configured to mount to a circuit carrier, the planar contact portion lying in a second plane; and
wherein the first plane intersects the second plane.

13. The apparatus of claim 12, further comprising:
a second lead frame coupled to a second planar surface of the semiconductor die opposite the first planar surface, the second planar surface oriented generally parallel to the first plane; and
wherein the second lead frame includes a second terminal portion, the second terminal portion including a second planar contact portion oriented generally parallel to the second plane.

14. The apparatus of claim 12,
wherein the loop shaped portion defines an opening enabling heat dissipation from the semiconductor die.

15. The apparatus of claim 14, wherein the loop shaped portion of the lead frame is attached to an active region of the semiconductor die.

16. The apparatus of claim 15, wherein a process of attaching the at least one lead frame to the semiconductor die is selected from the group consisting of silver sintering, conductive gluing, riveting, brazing, laser welding, and resistance welding.

17. An apparatus, comprising:
a semiconductor die having a planar surface including an electrical pad terminal; and
a lead frame including a first portion formed in the shape of a closed loop and a second portion extending away from an edge of the closed loop for the first portion;
wherein the first portion formed in the shape of a closed loop is attached at all points of the loop to the semiconductor die across the planar surface to make electrical contact with the electrical pad terminal; and
wherein the second portion extends beyond a peripheral edge of the semiconductor die.

18. The apparatus of claim 17, wherein the second portion of the lead frame that extends beyond the peripheral edge of the semiconductor die includes a bend such that a terminal end of the second portion extends parallel to a side surface of the semiconductor die.

19. An apparatus, comprising:
a semiconductor die having a planar surface including an electrical pad terminal; and
a lead frame including a first portion formed in the shape of a closed loop and a second portion extending away from an edge of the closed loop for the first portion;
wherein the first portion formed in the shape of a closed loop is attached the planar surface to make electrical contact with the electrical pad terminal;
wherein the second portion extends beyond a peripheral edge of the semiconductor die; and
wherein the first portion of the lead frame formed in the shape of the closed loop defines a central open region exposing a portion of the first planar surface of the semiconductor die.

20. A semiconductor element, comprising:
a semiconductor die; and
at least one lead frame comprising an opening surrounded by a loop shaped portion of the lead frame and a lead frame end portion;
wherein the loop shaped portion of the at least one lead frame is attached to the semiconductor die at a connection region, the connection region providing an electrical connection to and mechanical support for the semiconductor die;
wherein the lead frame end portion is formed as a terminal configured to mount the semiconductor die on a circuit carrier;
wherein a first lead frame is attached to a first surface of the semiconductor die and a second lead frame is attached to a second surface of the semiconductor die such that the semiconductor die is sandwiched between two lead frames; and
wherein the opening of each lead frame enabling heat dissipation of the semiconductor die.

21. The semiconductor element according to claim 20, wherein the semiconductor die comprises active regions; and
wherein the connection region of the semiconductor die corresponds to the active regions of the semiconductor die.

22. The semiconductor element according to claim 20, wherein the end portion of each lead frame is bent to form the terminal of the semiconductor element to be mounted on the circuit carrier such that the plane defined by the semiconductor die extends across the plane defined by the at least one lead frame terminal.

23. The semiconductor element according to claim 22, wherein the end portion of each lead frame points in the direction of the surface of the semiconductor die to which the lead frame is attached and the length of the end portion of each lead frame enables mounting all terminal portions of the lead frames attached to the semiconductor die adjacently on a surface of the circuit carrier.

24. The semiconductor element according to claim 20, wherein the semiconductor die and the at least one lead frame is housed in a package.

25. The semiconductor element according to claim 20, wherein the attachment of each lead frame to the semiconductor die at the connection region is realized by one of the following: silver sintering, conductive gluing, riveting, brazing, laser welding or resistance welding.

26. An apparatus, comprising:
a semiconductor die; and
at least one lead frame coupled to a first planar surface of the semiconductor die, the first planar surface lying in a first plane;
wherein the at least one lead frame includes a terminal portion, the terminal portion including a planar contact portion configured to mount to a circuit carrier, the planar contact portion lying in a second plane;
wherein the first plane intersects the second plane;
wherein the at least one lead frame includes a loop shaped portion formed in a loop shape that is attached at all points of the loop shape to the first planar surface of the semiconductor die; and
wherein the loop shaped portion defines an opening enabling heat dissipation from the semiconductor die.

27. The apparatus of claim 26, wherein the loop shaped portion of the lead frame corresponds to an active region of the semiconductor die.

28. The apparatus of claim 27, wherein a process of attaching the at least one lead frame to the semiconductor die is selected from the group consisting of silver sintering, conductive gluing, riveting, brazing, laser welding, and resistance welding.

* * * * *